United States Patent
Saito

(10) Patent No.: US 9,750,138 B2
(45) Date of Patent: Aug. 29, 2017

(54) CIRCUIT MODULE

(71) Applicant: Murata Manufacturing Co., Ltd., Nagaokakyo-shi, Kyoto-fu (JP)

(72) Inventor: Tomoko Saito, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 242 days.

(21) Appl. No.: 13/958,768

(22) Filed: Aug. 5, 2013

(65) Prior Publication Data

US 2014/0063751 A1   Mar. 6, 2014

(30) Foreign Application Priority Data

Aug. 28, 2012 (JP) ................................ 2012-187422

(51) Int. Cl.
*H05K 1/18* (2006.01)
*H05K 1/02* (2006.01)

(52) U.S. Cl.
CPC ........... *H05K 1/181* (2013.01); *H05K 1/0295* (2013.01); *H01L 2924/19105* (2013.01); *H05K 1/0269* (2013.01); *H05K 2201/10636* (2013.01); *Y02P 70/611* (2015.11)

(58) Field of Classification Search
CPC .......... H05K 2201/09372; H05K 2201/09381; H05K 2201/09418; H05K 2201/09409
USPC ................ 361/808, 760, 768, 810, 811, 807, 361/761–767
See application file for complete search history.

(56) References Cited

U.S. PATENT DOCUMENTS

| | | | | |
|---|---|---|---|---|
| 4,734,825 A | * | 3/1988 | Peterson | ........................ 361/792 |
| 5,844,257 A | * | 12/1998 | Chen | ........................ H01L 33/62 |
| | | | | 257/81 |
| 6,320,139 B1 | * | 11/2001 | Byle et al. | .................... 174/261 |
| 2002/0043396 A1 | | 4/2002 | Morimoto et al. | |
| 2007/0082513 A1 | * | 4/2007 | Zheng | .................. H05K 7/1069 |
| | | | | 439/70 |

(Continued)

FOREIGN PATENT DOCUMENTS

JP     63-86465 U    6/1988
JP     2-8165 U      1/1990

(Continued)

OTHER PUBLICATIONS

Official Communication issued in corresponding European Patent Application No. 2012-187422, mailed on Jul. 1, 2014.

*Primary Examiner* — Hoa C Nguyen
*Assistant Examiner* — Christopher L Augustin
(74) *Attorney, Agent, or Firm* — Keating & Bennett, LLP

(57) ABSTRACT

A circuit module includes a circuit board and electronic components mounted on the circuit board. The mounted electronic components include at least one discrimination-target electronic component and at least one module-discrimination electronic component. In addition, the circuit board includes land electrodes allowing the module-discrimination electronic component to be mounted at different positions and/or orientations with respect to the circuit board, and the module-discrimination electronic component is mounted at any one position and/or orientation among different positions and/or orientations with respect to the circuit board in accordance with the type of the discrimination-target electronic component.

20 Claims, 13 Drawing Sheets

(56) References Cited

U.S. PATENT DOCUMENTS

2008/0150157 A1* 6/2008 Nishimura ............ H01L 21/563
                                                                257/777
2009/0080167 A1* 3/2009 Kishida et al. ............... 361/752
2009/0258511 A1* 10/2009 Weinstein et al. .............. 439/69
2011/0278054 A1* 11/2011 Lee et al. ...................... 174/260

FOREIGN PATENT DOCUMENTS

| JP | 11-238952 A | 8/1999 |
|---|---|---|
| JP | 2002-124539 A | 4/2002 |
| JP | 2004-226127 A | 8/2004 |
| JP | 2005-64177 A | 3/2005 |
| JP | 2008-235759 A | 10/2008 |

* cited by examiner

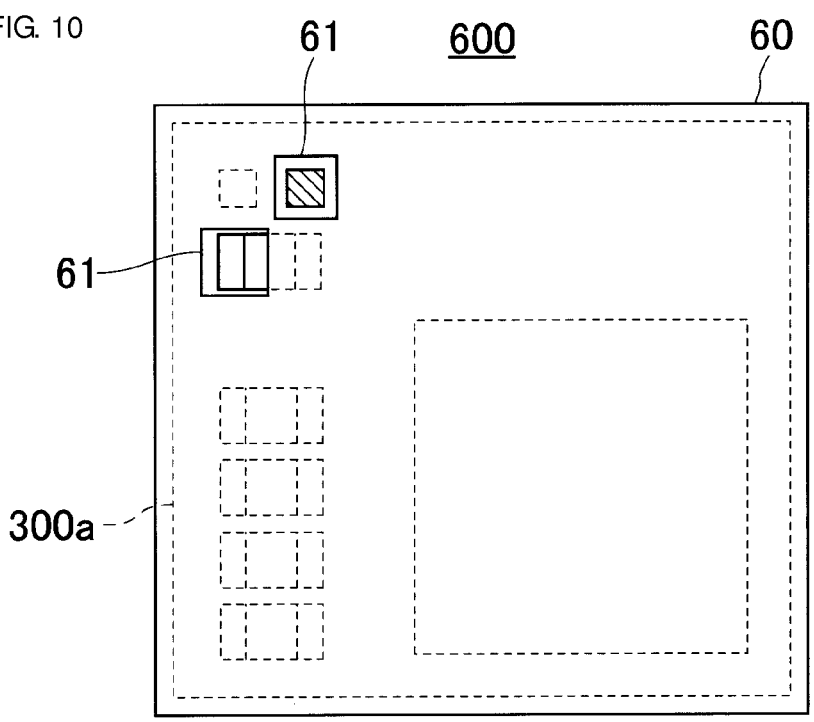

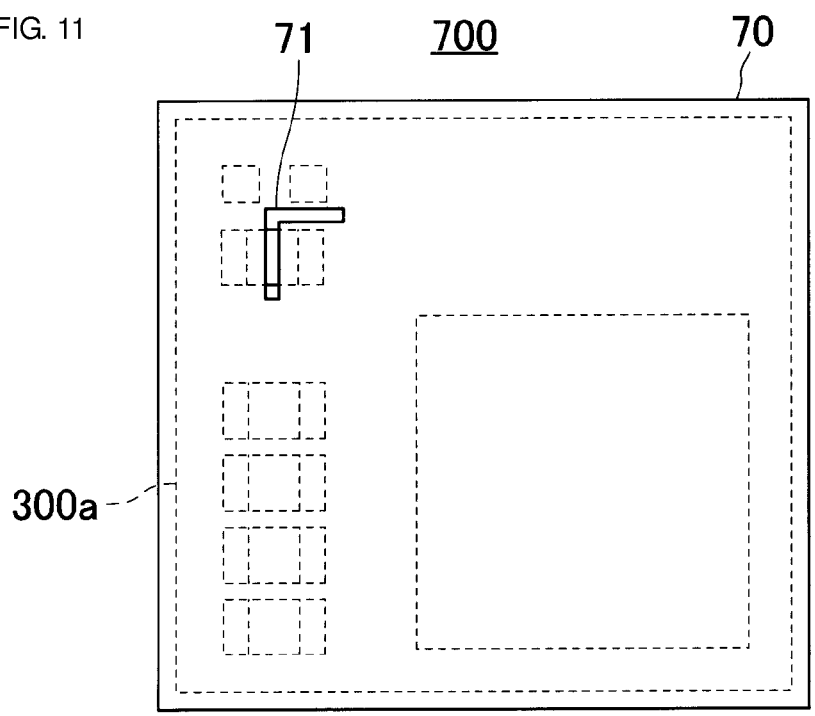

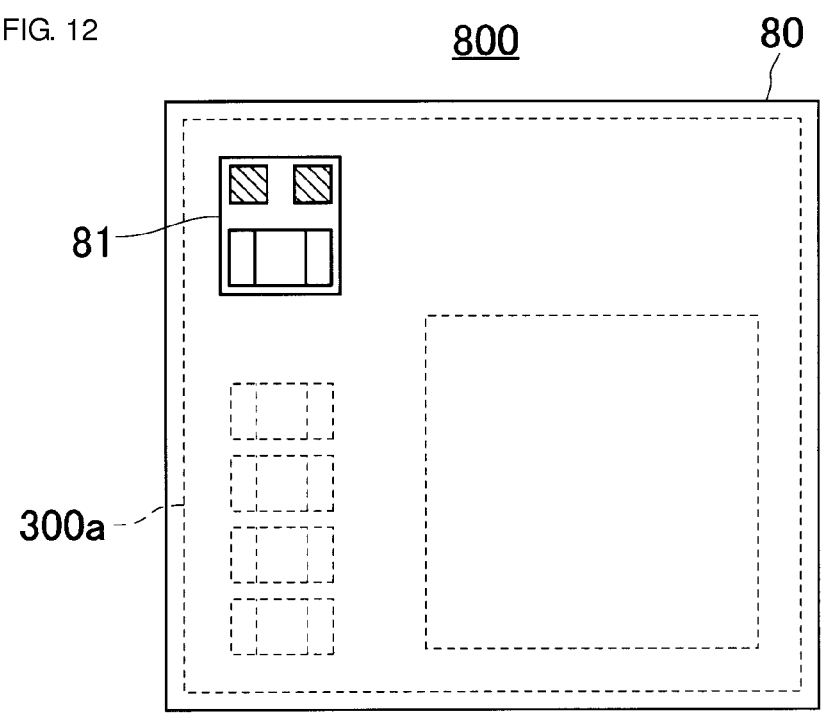

CIRCUIT MODULE

BACKGROUND OF THE INVENTION

1. Field of the Invention

The present invention relates to circuit modules in which an electronic component is mounted on a circuit board.

2. Description of the Related Art

A circuit module having a configuration in which a bump-mounted electronic component, a wire-bonding-mounted electronic component or a surface-mounted electronic component is mounted on a printed board is described in Japanese Unexamined Patent Application Publication No. 2008-235759.

For such circuit modules, it is increasingly the case that electronic components having different characteristics are mounted to replace some electronic components previously mounted on the printed board and the circuit module is shipped as an improved product over the previous circuit module. In the case where new electronic components having improved characteristics are produced, production of previously mounted electronic components is stopped or the firmware of some mounted electronic components is updated, for example, circuit modules are manufactured in which new electronic components having improved characteristics, replacement components for electronic components whose production has stopped or electronic components whose firmware has been updated are mounted as components to replace the electronic components previously mounted on the printed board in the process of manufacturing subsequent circuit modules.

It is often the case that the configurations of the previously mounted electronic components and the replacement mounted electronic components are the same in terms of shape, size, arrangement of pins and so forth, and a printed board having the same design as the printed board on which the previous electronic components were mounted is often used without modifying the design of the printed board since in this way it is possible to eliminate the expense of modifying the design of the printed board.

In such a case, since the characteristics of the mounted electronic components have changed, a circuit module in which an electronic component having improved characteristics or updated firmware is mounted is handled as a different product from the previous circuit module.

However, as described above, for a circuit module that is an improved product having mounted therein electronic components having improved characteristics or updated firmware, these mounted electronic components may have the same shapes, sizes and so forth as the previously mounted electronic components and the same printed board may be used in the circuit module and therefore it is not possible to discriminate from their appearances these circuit modules from the previous circuit modules in which previous components are mounted. Consequently, there has been a problem in that if the previous products become mixed in with one-time improved products, they cannot be discriminated from their appearances and components having different characteristics are shipped out, so as to cause a problem in terms of characteristics at the shipping destination.

SUMMARY OF THE INVENTION

Therefore, preferred embodiments of the present invention provide circuit modules that can be discriminated from one another despite including printed boards having the same design and circuit configuration.

A circuit module according to a preferred embodiment of the present invention includes a circuit board and electronic components mounted on the circuit board. The electronic components include at least one discrimination-target electronic component and at least one module-discrimination electronic component. The circuit board includes land electrodes allowing the module-discrimination electronic component to be mounted at different positions and/or orientations with respect to the circuit board. The module-discrimination electronic component is mounted at any one position and/or orientation among different positions and/or orientations with respect to the circuit board in accordance with the type of the discrimination-target electronic component.

In a circuit module according to a preferred embodiment of the present invention, the module-discrimination electronic component, which will be described later, is mounted at a position and/or an orientation corresponding to the type of the discrimination-target electronic component, which will be described later. Consequently, even in the case where circuit boards having the same design and circuit configuration are used in this circuit module, the specific types of discrimination-target electronic components are mounted thereon can be checked and discriminated between by visually checking the positions and/or orientations of the module-discrimination electronic components with respect to the circuit boards.

In a circuit module according to a preferred embodiment of the present invention, one terminal of the module-discrimination electronic component is preferably mounted at a certain position on the circuit board.

With this configuration, the location where the module-discrimination electronic component can be located on the circuit board is limited and therefore the module-discrimination electronic component can be easily checked and the time taken to discriminate between circuit modules can be reduced.

In a circuit module according to a preferred embodiment of the present invention, the circuit board preferably includes a plurality of land electrodes that mount another terminal of the module-discrimination electronic component, and the other terminal of the module-discrimination electronic component is preferably mounted on any one of the plurality of land electrodes that mount another terminal of the module-discrimination electronic component in accordance with the type of the discrimination-target electronic component.

With this configuration, the module-discrimination electronic component can take as many different mounting states, that is, can be mounted at as many different positions and/or orientations, with respect to the circuit board as there are land electrodes, and a number of types of discrimination-target electronic components corresponding to the number of mounting states can be discriminated between.

In a circuit module according to a preferred embodiment of the present invention, the plurality of land electrodes that mount another terminal of the module-discrimination electronic component are preferably electrically connected to each other by a connection electrode on a surface of or inside the circuit module.

With this configuration, regardless of which land electrode among the plurality of land electrodes the other terminal is mounted on, the module-discrimination electronic component can operate in the same way in an electronic circuit located on the circuit board.

In a circuit module according to a preferred embodiment of the present invention, the electronic components are preferably electrically connected to each other by a connection electrode on a surface of or inside the circuit module.

With this configuration, an electronic circuit that causes the electronic components mounted on the circuit board to perform desired operations is provided.

A circuit module according to a preferred embodiment of the present invention preferably includes a plurality of module-discrimination electronic components.

With this configuration, the number of combinations of positions and/or orientations of the plurality of module-discrimination electronic components is large compared with the number of positions and/or orientations that can be adopted in the case where there is just one module-discrimination electronic component. Consequently, the number of types of discrimination-target electronic components that can be discriminated between can be increased.

In a circuit module according to a preferred embodiment of the present invention, a vertical length and a horizontal length of the module-discrimination electronic component are preferably different from each other when viewed in plan.

With this configuration, the orientation with which the module-discrimination electronic component is mounted with respect to the circuit board can be easily checked.

In a circuit module according to a preferred embodiment of the present invention, the circuit module preferably includes a protective member above the circuit board and the electronic components and a hole or recess is provided in the protective member above a portion of or an entirety of the module-discrimination electronic component so as to allow a portion of or an entirety of the module-discrimination electronic component to be seen when the circuit module is viewed in plan.

With this configuration, even though the circuit module includes a protective member arranged to protect the electronic components, the module-discrimination electronic component can be visually checked and the circuit module can be discriminated.

According to various preferred embodiments of the present invention, circuit modules that can be discriminated between even if they include a circuit board having the same design and circuit configuration are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 illustrates an example of a circuit module according to a sixth preferred embodiment of the present invention.

FIG. 11 illustrates an example of a circuit module according to a seventh preferred embodiment of the present invention.

FIG. 12 illustrates an example of a circuit module according to an eighth preferred embodiment of the present invention.

DETAILED DESCRIPTION OF THE PREFERRED EMBODIMENTS

Figure 1:
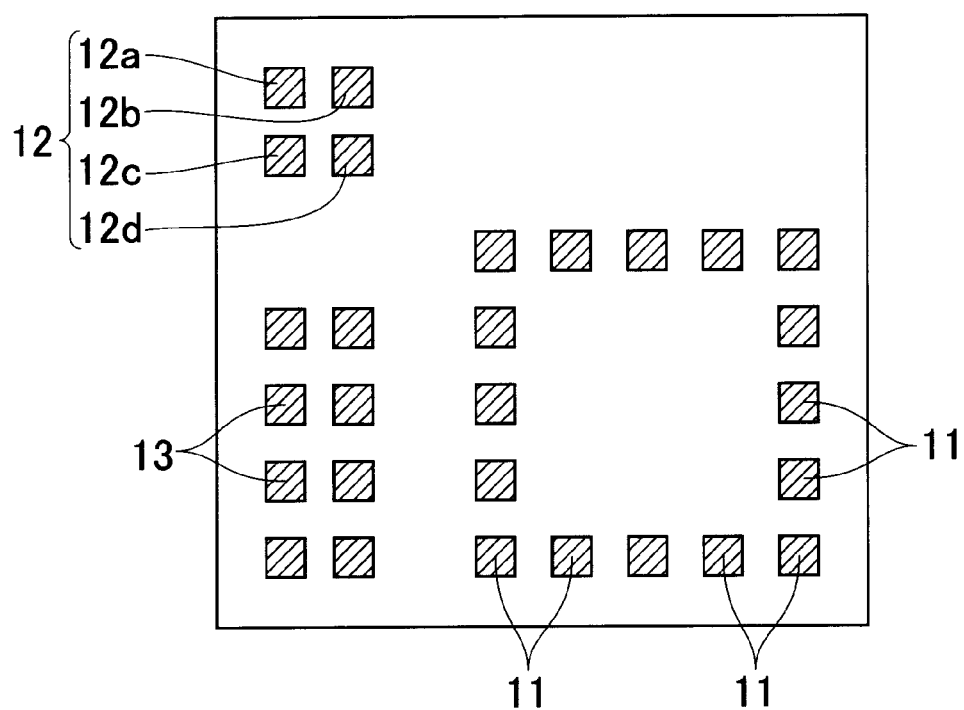
FIG. 1 is a plan view of a circuit board that is included in a circuit module according to a first preferred embodiment of the present invention.

Hereafter, preferred embodiments of the present invention will be described while referring to the drawings. In all of the drawings, like reference symbols denote like elements. The drawings are not limiting and are for the purpose of description and for facilitating description of example preferred embodiments of the present invention.

First Preferred Embodiment

A circuit module of a first preferred embodiment of the present invention will be described while referring to FIG. 1 and FIGS. 2A and 2B.

FIG. 1 is a plan view of a circuit board 10 that is included in circuit modules 100*a* and 100*b* according to the first preferred embodiment of the present invention. The circuit board 10 includes land electrodes 11, 12 and 13 to mount a plurality of electronic components on one main surface thereof. The circuit board 10 may be a through hole mount board or a surface mount board. In addition, the circuit board 10 may include wiring patterns that electrically connect the land electrodes to each other so as to define an electronic circuit when electronic components are mounted on the land electrodes 11, 12 and 13. The circuit board may be a single-layer board or a multilayer board and the material thereof may be a resin or a ceramic.

The land electrodes 11 are land electrodes that mount any of discrimination-target electronic components 14a, 14b and 14c. In the specification of the present application, the term "discrimination-target electronic component" refers to electronic components that have the same or similar appearances in terms of, for example, size, shape and pin arrangement, but are in fact different types of electronic components and for which it is necessary to discriminate between circuit modules in which these electronic components are mounted in accordance with their type. The discrimination-target electronic components 14a, 14b and 14c illustrated in FIGS. 2A and 2B, FIGS. 4A and 4B, FIGS. 6A, 6B and 6C, FIGS. 8A and 8B and FIGS. 9A and 9B, which will be described later, are different types of electronic component. Here, the term "different types" refers to electronic components having the same appearance and function but different characteristics. For example, the discrimination-target electronic component 14a may be a prior-to-firmware-update IC and the discrimination-target electronic component 14b may be an after-firmware-update IC. As another example, the discrimination-target electronic components 14a and 14b may respectively be a prior-to-characteristics-improvement electronic component and an after-characteristics-improvement new electronic component or may respectively be an electronic component for which production has stopped and a replacement component for the component for which production has stopped.

In addition, the land electrodes 12 (12a, 12b, 12c and 12d) are land electrodes that mount a module-discrimination electronic component 15. In the specification of the present application, the term "module-discrimination electronic component" refers to an electronic component that is mounted at different positions and/or orientations with respect to the circuit board in accordance with the type of the discrimination-target electronic component in order to enable circuit modules to be discriminated between in accordance with the types of discrimination-target electronic components mounted therein. The module-discrimination electronic component 15 may be any electronic component mounted in the circuit module, but is preferably a comparatively small electronic component from the viewpoint of efficient use of space on the circuit board. For example, the module-discrimination electronic component 15 may be a bypass capacitor. In addition, the module-discrimination electronic component 15 is preferably an electronic component that has a different vertical length and horizontal length when viewed in plan in order to enable the orientation with which the module-discrimination electronic component 15 is mounted with respect to the circuit board to be easily checked when the module-discrimination electronic component 15 mounted on the circuit board is viewed in plan.

In addition, the land electrodes 13 are land electrodes that mount electronic components 16, which are electronic components other than the discrimination-target electronic component 14 (14a, 14b and 14c) and the module-discrimination electronic component 15 among electronic components mounted on the circuit board 10.

In the circuit modules 100a and 100b according to the first preferred embodiment of the present invention, the land electrodes 12a and 12b among the land electrodes 12 that mount the module-discrimination electronic component 15 illustrated in FIG. 1 are electrodes to which the same voltage is applied, and the land electrodes 12c and 12d among the land electrodes 12 that mount the module-discrimination electronic component 15 are electrodes to which the same voltage is applied, the voltage being different to that applied to the land electrodes 12a and 12b. For example, the land electrodes 12a and 12b are connected to a ground electrode and the land electrodes 12c and 12d are connected to a power supply wiring line. Land electrodes to which the same voltage is applied may be electrically connected to each other by a connection electrode on the surface of or inside the circuit board. For example, the land electrodes 12a and 12b may be electrically connected to each other with a connection electrode (not illustrated) on the surface of or inside the circuit board and the land electrodes 12c and 12d may be electrically connected to each other with a connection electrode (not illustrated) on the surface of or inside the circuit board.

Figure 2:
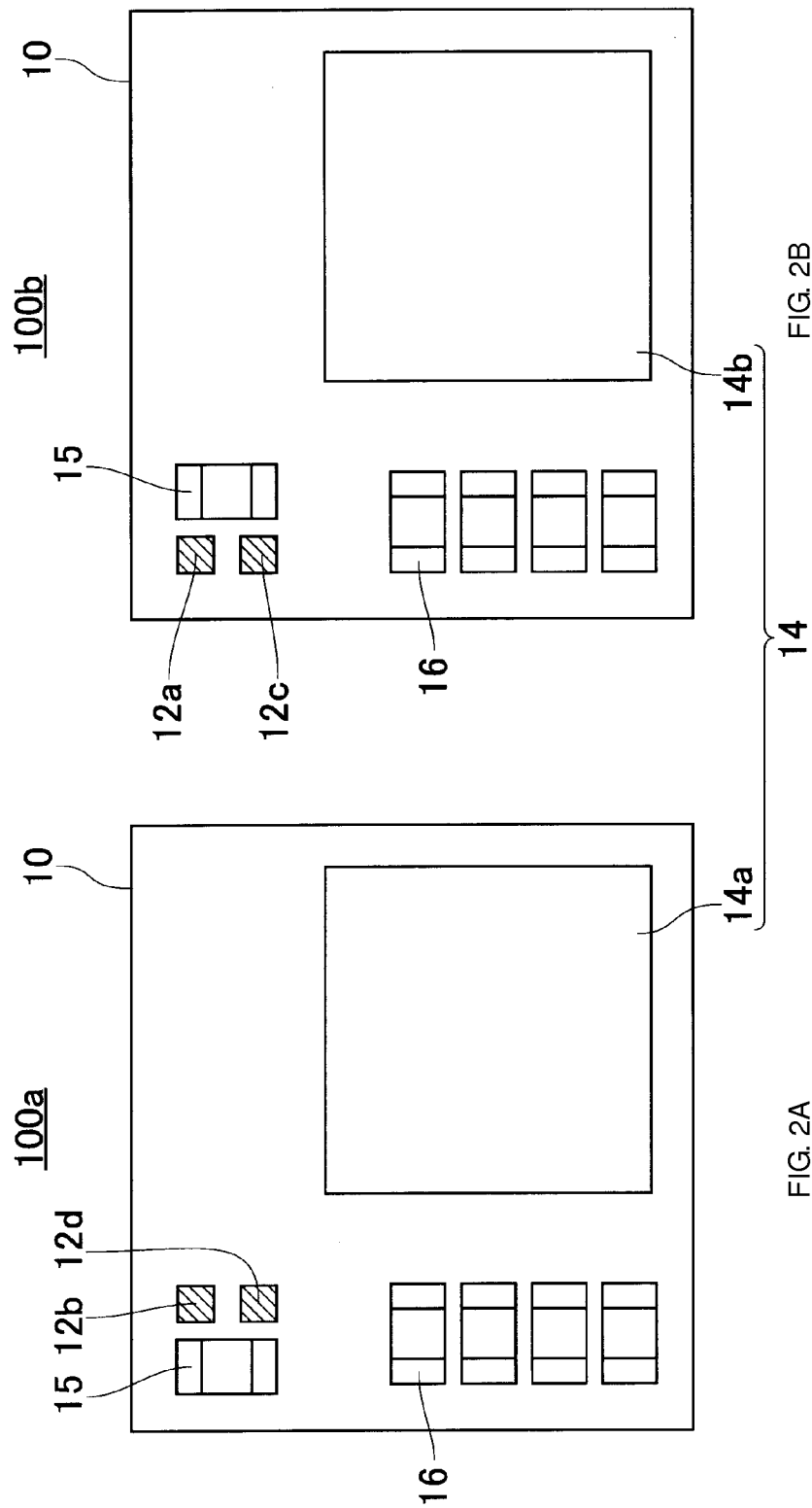
FIG. 2A illustrates an example of the mounting state of the circuit module according to the first preferred embodiment of the present invention and FIG. 2B illustrates another example of the mounting state of the circuit module according to the first preferred embodiment of the present invention.

FIG. 2A and FIG. 2B respectively illustrate the circuit modules 100a and 100b according to the first preferred embodiment of the present invention, which are obtained by mounting electronic components on the circuit board 10 illustrated in FIG. 1. The mounted electronic components include one discrimination-target electronic component (14a or 14b) and one module-discrimination electronic component 15. The discrimination-target electronic component 14a illustrated in FIG. 2A and the discrimination-target electronic component 14b illustrated in FIG. 2B are different types of component as described above. The mounted electronic components are electrically connected to each other by connection electrodes (not illustrated) on the surface of or inside the circuit module so as to define an electronic circuit that causes the electronic components to perform desired operations.

The module-discrimination electronic components 15 are mounted so that their positions or orientations with respect to the circuit board are different from each other in accordance with the types of the discrimination-target electronic components 14, that is, in accordance with whether the component is the discrimination-target electronic component 14a or the discrimination-target electronic component 14b. In the circuit module of FIG. 2A, the discrimination-target electronic component 14a is mounted and therefore, in accordance with this, the module-discrimination electronic component 15 is mounted on the land electrodes 12a and 12c on the circuit board 10. In the circuit module of FIG. 2B, the discrimination-target electronic component 14b is mounted and therefore, in accordance with this, the module-discrimination electronic component 15 is mounted on the land electrodes 12b and 12d on the circuit board 10.

By adopting the above-described configuration, even if circuit boards 10 that have the same design and circuit configuration are used and electronic components that appear to be the same in terms of size and shape are mounted on a main surface thereof, it is possible to discriminate whether a mounted electronic component is the discrimination-target electronic component 14a or the discrimination-target electronic component 14b by checking whether the module-discrimination electronic component 15 is mounted on the land electrodes 12a and 12c or on the land electrodes 12b and 12d.

One of the unique features of the present preferred embodiment of the present invention is that components different from the electronic components that need to be discriminated between in terms of type (that is, the discrimination-target electronic components 14) are used as discrimination markers and the components used as discrimination markers are used as electronic components (that is, the module-discrimination electronic component 15) mounted in the circuit modules.

As has been described above, the module-discrimination electronic component 15 can take different positions and/or orientations on the circuit board 10 and therefore the circuit board 10 used in the circuit module according to the first preferred embodiment of the present invention is provided with a plurality of land electrodes for the module-discrimination electronic component 15. However, in the circuit module according to the first preferred embodiment of the present invention, components other than the discrimination-target electronic components 14, which are electronic components that need to be discriminated between in terms of type, are used as module-discrimination components and therefore components that are comparatively small among the mounted electronic components and have a small effect on the efficient use of wiring space on the circuit board can be selected and therefore there is substantially no disadvantage to a plurality of land electrodes being necessary. In addition, the module-discrimination component is to be an electronic component that is originally intended to be mounted on the circuit board and therefore there is an advantage from the viewpoint of efficient use of space on the printed board and cost reduction regarding additional members in that there is no need to additionally mount a module-discrimination member.

In FIGS. 2A and 2B, two mounting states are illustrated as examples in which the module-discrimination electronic components are mounted at different positions, but among other examples of a mounting state using the circuit board of FIG. 1, a state in which a module-discrimination electronic component is mounted on the land electrodes 12a and 12d and a state in which a module-discrimination electronic component is mounted on the land electrodes 12b and 12c can be considered as different mounting states with which discrimination is similarly possible. In addition, in FIG. 1, as an example, the land electrodes 12a to 12d that mount the module-discrimination electronic component 15, are arranged adjacent to one another, but, for example, the land electrodes 12a and 12c may be arranged at a location on the circuit board separated from the land electrodes 12b and 12d.

Second Preferred Embodiment

A circuit module of a second preferred embodiment of the present invention will be described while referring to FIG. 3 and FIGS. 4A and 4B.

In the circuit module according to the second preferred embodiment of the present invention, one terminal of the module-discrimination electronic component is mounted at a certain position on the circuit board.

Figure 3:
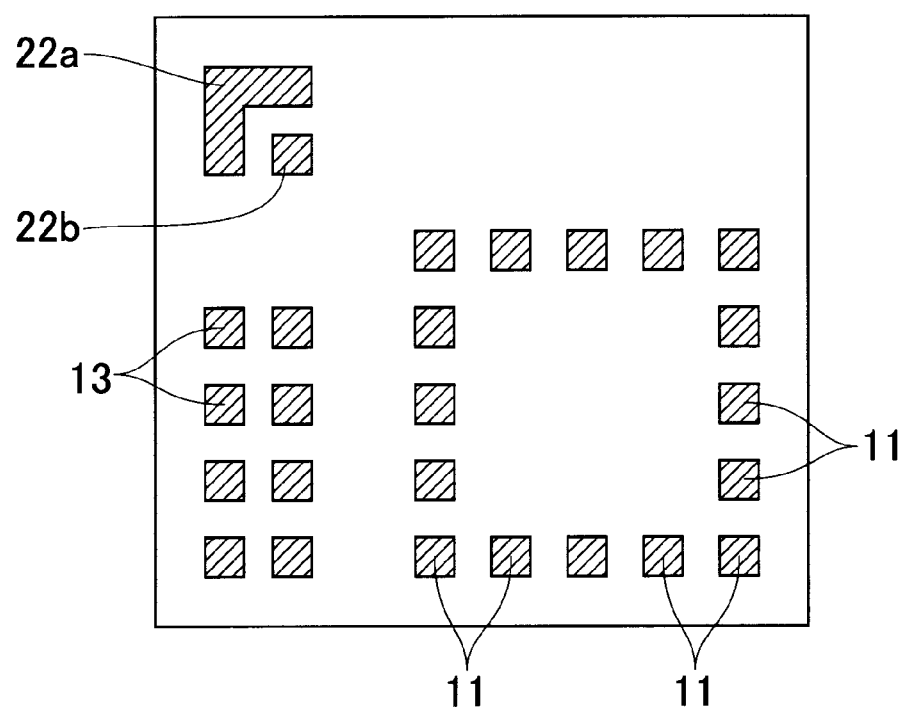
FIG. 3 is a plan view of a circuit board that is included in a circuit module according to a second preferred embodiment of the present invention.

FIG. 3 is a plan view of a circuit board 20 that is included in circuit modules 200a and 200b according to the second preferred embodiment of the present invention. The circuit board 20 according to the second preferred embodiment of the present invention illustrated in FIG. 3 differs from the circuit board 10 illustrated in FIG. 1 in terms of the land electrodes that mount the module-discrimination electronic component 15 and the rest of its configuration is preferably the same or substantially the same as that illustrated in FIG. 1. A land electrode 22b of the circuit board 20 illustrated in FIG. 3 is a land electrode that mounts one terminal of the module-discrimination electronic component 15, and an L-shaped or substantially L-shaped land electrode 22a of the circuit board 20 illustrated in FIG. 3 is a land electrode that mounts another terminal of the module-discrimination electronic component 15. For example, the L-shaped or substantially L-shaped land electrode 22a is connected to a ground electrode and the land electrode 22b is connected to a power supply wiring line.

Figure 4:
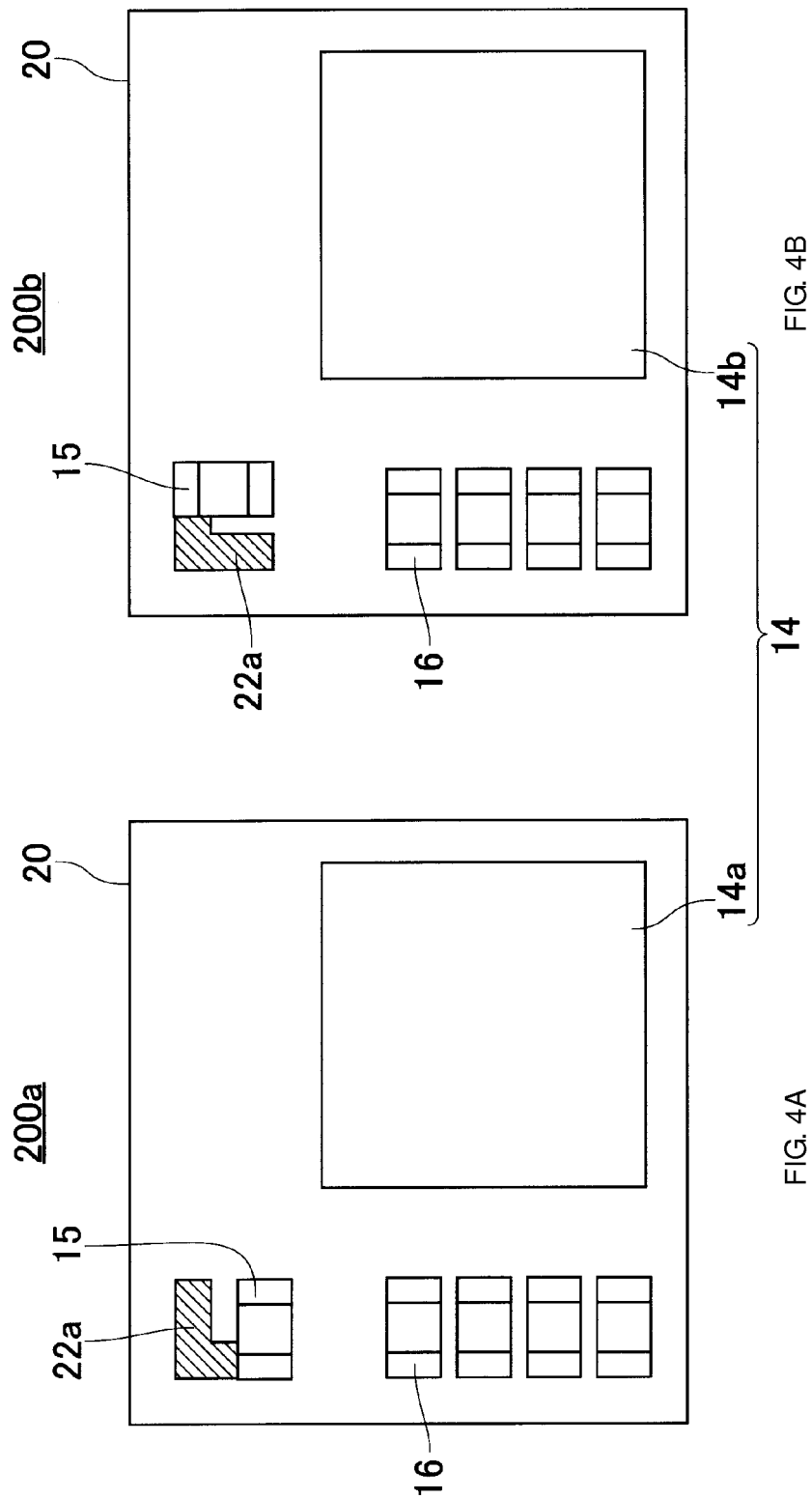
FIG. 4A illustrates an example of the mounting state of the circuit module according to the second preferred embodiment of the present invention and FIG. 4B illustrates another example of the mounting state of the circuit module according to the second preferred embodiment of the present invention.

The circuit modules 200a and 200b illustrated in FIG. 4A and FIG. 4B are each a circuit module according to the second preferred embodiment of the present invention obtained by mounting electronic components on the circuit board 20 illustrated in FIG. 3. The electronic components mounted in the circuit modules 200a and 200b illustrated in FIGS. 4A and 4B, similarly to as in FIGS. 2A and 2B, include one discrimination-target electronic component 14 and one module-discrimination electronic component 15. In addition, a discrimination-target electronic component 14a illustrated in FIG. 4A and a discrimination-target electronic component 14b illustrated in FIG. 4B, similarly to as in FIG. 2A and FIG. 2B, are different types of component.

With respect to the module-discrimination electronic component 15, the circuit modules 200a and 200b share a common point in that one terminal of the module-discrimination electronic component 15 is mounted at a certain position, that is, on the land electrode 22b on the circuit board and the other terminal of the module-discrimination electronic component 15 is mounted on the L-shaped or substantially L-shaped land electrode 22a, but the mounting orientations of the module-discrimination electronic components 15 with respect to the circuit board 20 are different from each other. In other words, in the case where the mounted discrimination-target electronic component is the discrimination-target electronic component 14a, the module-discrimination electronic component 15 is mounted so as to be arranged with a horizontal orientation with respect to the circuit board as illustrated in FIG. 4A, and in the case where the mounted discrimination-target electronic component is the discrimination-target electronic component 14b, the module-discrimination electronic component 15 is mounted so as to be arranged with a vertical orientation with respect to the circuit board as illustrated in FIG. 4B.

With the above-described configuration, the circuit modules according to the present preferred embodiment can exhibit the same effect as those of the first preferred embodiment. In addition, with this configuration, for the circuit modules according to the present preferred embodiment, one terminal of the module-discrimination electronic component is mounted at a certain position on the circuit board and therefore the position of the module-discrimination electronic component on the circuit board can be easily checked and the time taken to discriminate between circuit modules can be shortened. In addition, since the circuit boards are discriminated between on the basis of the orientation of the module-discrimination electronic component with respect to the circuit board, the difference is clear at a glance and the occurrence of human mistakes due to mis-recognition becomes less likely.

Third Preferred Embodiment

A circuit module of a third preferred embodiment of the present invention will be described while referring to FIG. 5 and FIGS. 6A, 6B and 6C.

In the circuit module according to the third preferred embodiment of the present invention, one terminal of the module-discrimination electronic component is mounted at a certain position on the circuit board and the other terminal of the module-discrimination electronic component is mounted on any one of a plurality of land electrodes.

Figure 5:
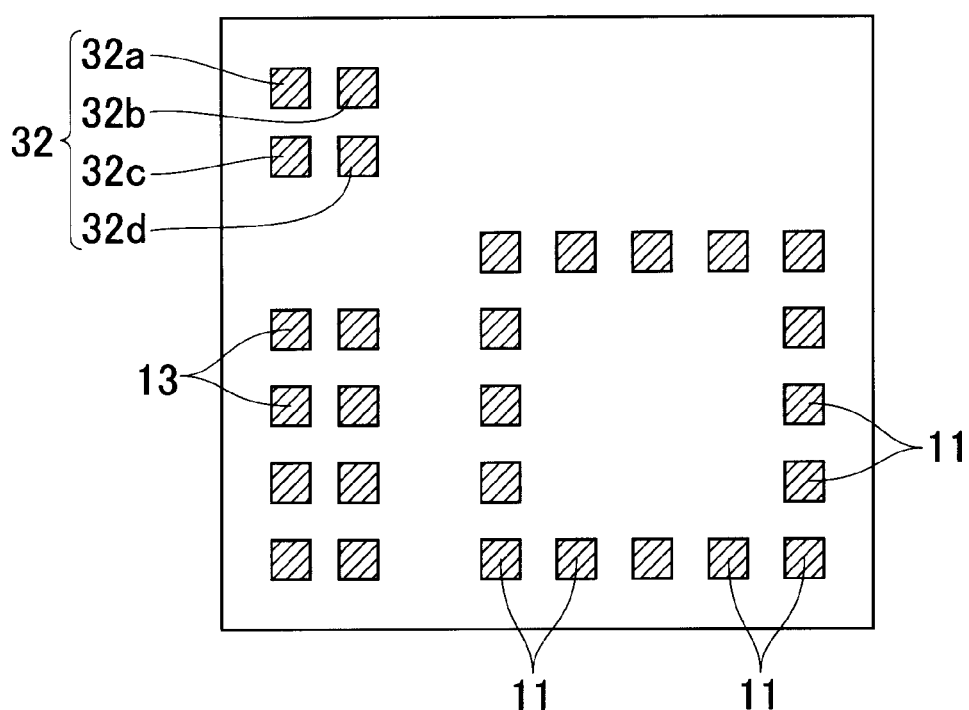
FIG. 5 is a plan view of a circuit board that is included in a circuit module according to a third preferred embodiment of the present invention.

FIG. 5 is a plan view of a circuit board 30 that is included in circuit modules 300a, 300b and 300c according to the third preferred embodiment of the present invention. Land electrodes 32a to 32d illustrated in FIG. 5 preferably have the same arrangement with respect to the circuit board as the land electrodes 12a to 12d illustrated in FIG. 1 but their electrical connection relations are different (not illustrated). That is, the land electrode 32d of the circuit board 30 illustrated in FIG. 5 is a land electrode that mounts one terminal of the module-discrimination electronic component 15, and land electrodes 32a to 32c of the circuit board 30 illustrated in FIG. 5 are land electrodes that mount the other terminal of the module-discrimination electronic component 15. For example, the land electrodes 32a to 32c are connected to a ground electrode and the land electrode 32d is connected to a power supply wiring line.

Figure 6:
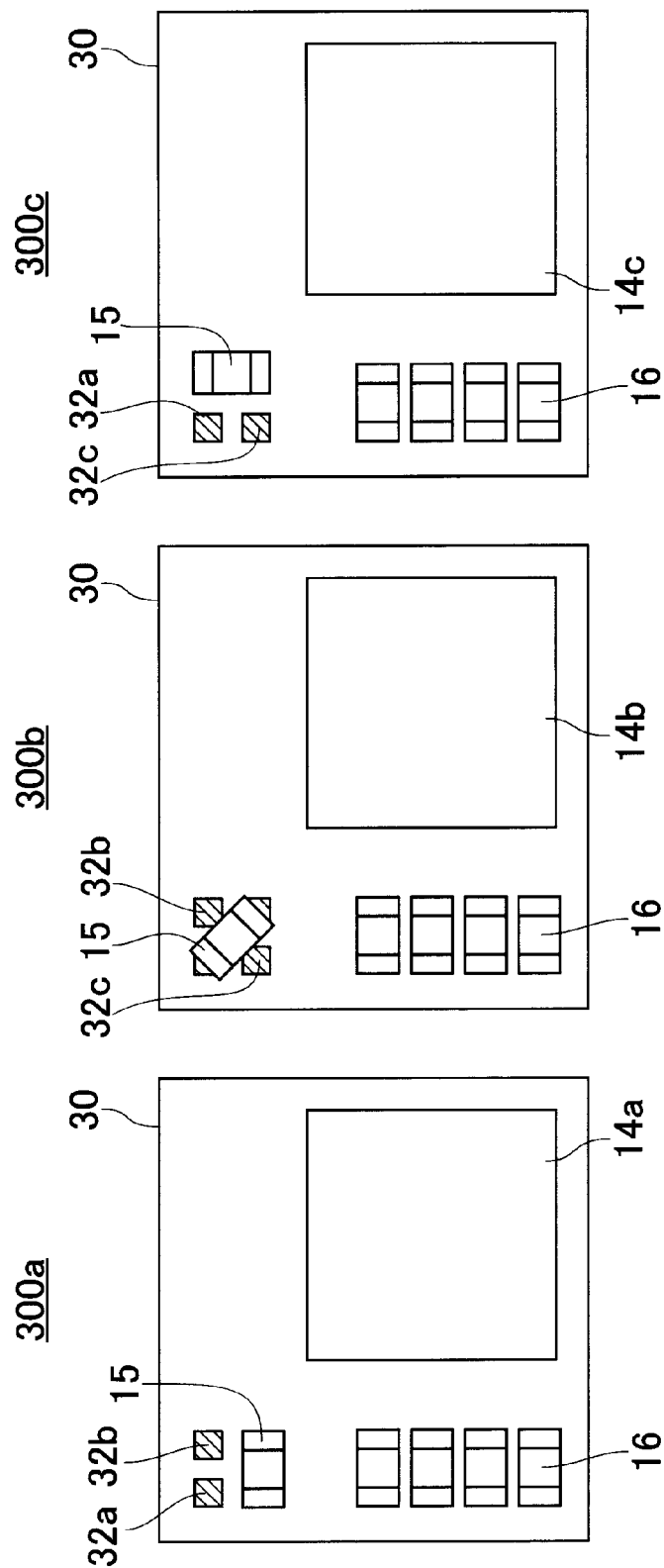
FIG. 6A illustrates an example of the mounting state of the circuit module according to the third preferred embodiment of the present invention.
FIG. 6B illustrates another example of the mounting state of the circuit module according to the third preferred embodiment of the present invention and FIG. 6C illustrates yet another example of the mounting state of the circuit module according to the third preferred embodiment of the present invention.

The circuit modules 300a, 300b and 300c illustrated in FIGS. 6A to 6C are each a circuit module according to the third preferred embodiment of the present invention obtained by mounting electronic components on the circuit board 30 illustrated in FIG. 5. The mounted electronic components illustrated in FIGS. 6A to 6C, similarly to as in FIGS. 2A and 2B, include one discrimination-target electronic component 14 and one module-discrimination electronic component 15. In addition, a discrimination-target electronic component 14a illustrated in FIG. 6A and a discrimination-target electronic component 14b illustrated in FIG. 6B, similarly to as in FIG. 2A and FIG. 2B, are different types of component.

In the circuit modules 300a, 300b and 300c illustrated in FIGS. 6A to 6C, one terminal of the module-discrimination electronic component 15 is mounted on the land electrode 32d and the other terminal of the module-discrimination electronic component 15 is mounted on any one of the plurality of land electrodes 32a to 32c in accordance with the type of the discrimination-target electronic component 14. In the case where the mounted discrimination-target electronic component is the discrimination-target electronic component 14a, as illustrated in FIG. 6A, one terminal of the module-discrimination electronic component 15 is mounted on the land electrode 32d and the other terminal of the module-discrimination electronic component 15 is mounted on the land electrode 32c. In addition, in the case where the mounted discrimination-target electronic component is the discrimination-target electronic component 14b, as illustrated in FIG. 6B, one terminal of the module-discrimination electronic component 15 is mounted on the land electrode 32d and the other terminal of the module-discrimination electronic component 15 is mounted on the land electrode 32a. In the case where the mounted discrimination-target electronic component is the discrimination-target electronic component 14c, as illustrated in FIG. 6C, one terminal of the module-discrimination electronic component 15 is mounted on the land electrode 32d and the other terminal of the module-discrimination electronic component 15 is mounted on the land electrode 32b.

With the above-described configuration, the circuit modules according to the present preferred embodiment can exhibit the same effect as those of the second preferred embodiment. In addition, with the above-described configuration, the circuit module according to the present preferred embodiment preferably includes three land electrodes to mount the other terminal of the module-discrimination electronic component and therefore the module-discrimination electronic component can take a number of different mounting states equal to this number of electrodes, that is, three, and the same number of types of discrimination target electronic component can be discriminated between. In the present preferred embodiment, as an example, there are three (32a, 32b and 32c) land electrodes that mount the other terminal of the module-discrimination electronic component, but instead there may be two or four or more.

Fourth Preferred Embodiment

A circuit module of a fourth preferred embodiment of the present invention will be described while referring to FIG. 7 and FIGS. 8A and 8B.

In the circuit module according to the fourth preferred embodiment of the present invention, a plurality of module-discrimination electronic components are mounted.

Figure 7:
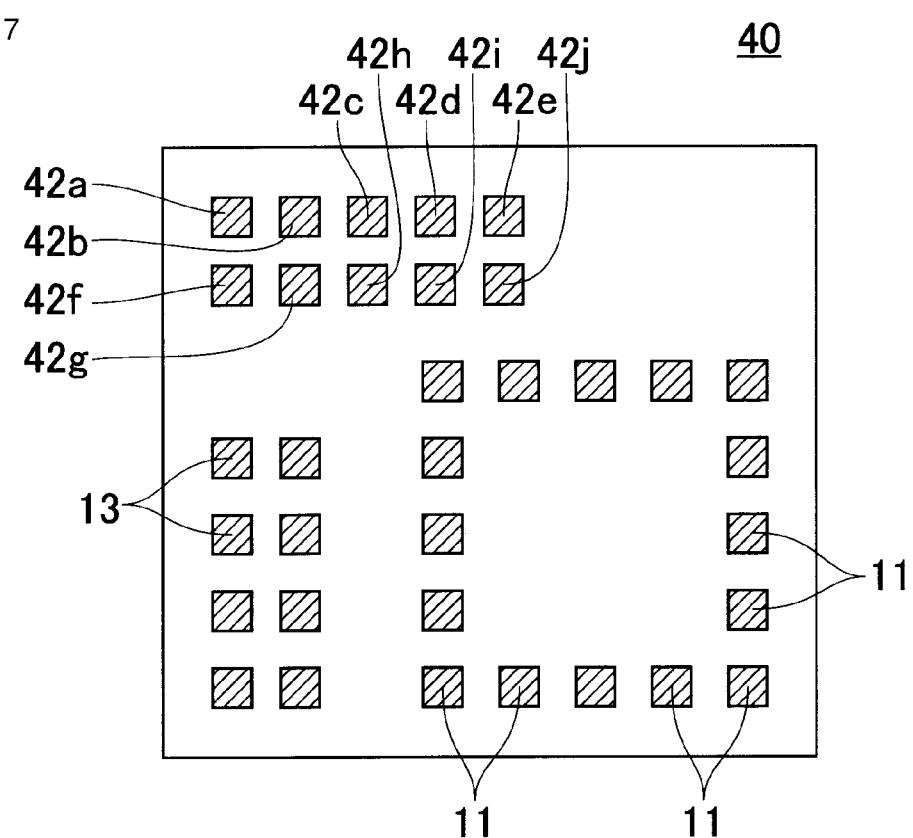
FIG. 7 is a plan view of a circuit board that is included in a circuit module according to fourth and fifth preferred embodiments of the present invention.

FIG. 7 is a plan view of a circuit board 40 that is included in circuit modules 400a and 400b according to the fourth preferred embodiment of the present invention. The circuit board of the fourth preferred embodiment illustrated in FIG. 7 includes land electrodes 42a to 42j that mount a plurality of module-discrimination electronic components 15.

Figure 8B:
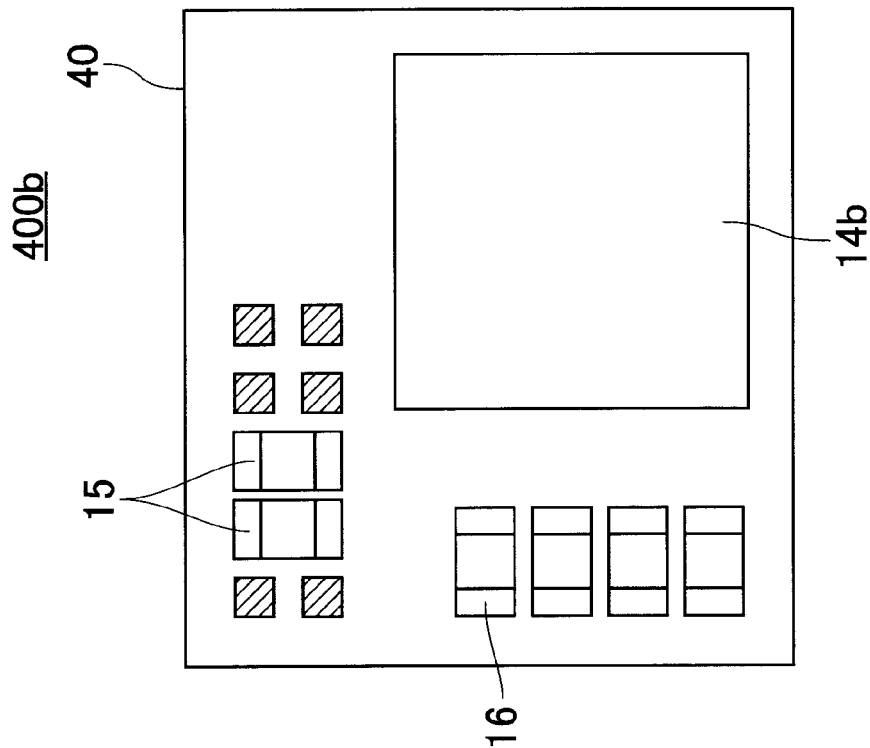
FIG. 8A illustrates an example of the mounting state of the circuit module according to the fourth preferred embodiment of the present invention and FIG. 8B illustrates another example of the mounting state of the circuit module according to the fourth preferred embodiment of the present invention.
Figure 8A:
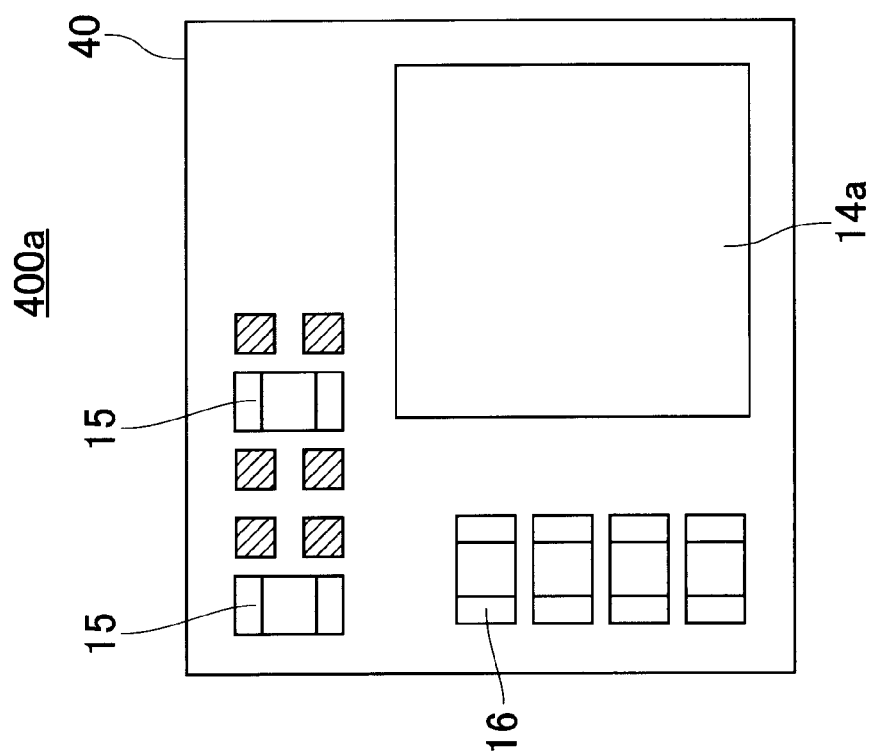

FIGS. 8A and 8B illustrate examples of the circuit module according to the fourth preferred embodiment of the present invention. Two module-discrimination electronic components 15 of the same type are mounted on the circuit board illustrated in FIG. 7. In the circuit board used in the circuit modules of FIGS. 8A and 8B, the land electrodes 42a to 42e of FIG. 7 are electrically connected to each other, and the land electrodes 42f to 42j of FIG. 7 are electrically connected to each other. In addition, the land electrodes 42a to 42e are land electrodes that mount one terminal of each of the module-discrimination electronic components 15 and the land electrodes 42f to 42j are land electrodes that mount the other terminal of each of the module-discrimination electronic components 15. For example, the land electrodes 42a to 42e are connected to the same ground electrode and the land electrodes 42f to 42j are connected to the same power supply wiring line.

With the above-described configuration, since the number of combinations of positions and/or orientations of the two module-discrimination electronic components is greater than the number of positions and/or orientations that a single module-discrimination electronic component can take, the number of types of discrimination-target electronic component that can be discriminated between can be increased. For example, in the case where one module-discrimination electronic component 15 is mounted so as to be arranged vertically with respect to the circuit board 40, the number of ways of arranging the module-discrimination electronic component is five. In contrast, as illustrated in FIGS. 8A and 8B, in the case where two module-discrimination electronic components of the same type are both mounted so as to be arranged vertically with respect to the circuit board 40, including the cases illustrated in FIGS. 8A and 8B, there are ten ways of arranging the module-discrimination electronic components. Consequently, in this example, the module-discrimination electronic components can take mounting states corresponding to ten different types of discrimination-target electronic component. Of course, if arrangements in which the module-discrimination electronic components are positioned diagonally with respect to the circuit board 40 are also included, for example, an arrangement in which one terminal is mounted on the land electrode 42a and the other terminal is mounted on the land electrode 42g, ten or more mounting states can be taken.

Fifth Preferred Embodiment

A circuit module of a fifth preferred embodiment of the present invention will be described while referring to FIG. 7 and FIGS. 9A and 9B.

In the circuit module according to the fifth preferred embodiment of the present invention, similarly to as in the fourth preferred embodiment, a plurality of module-discrimination electronic components are mounted.

Figure 9B:
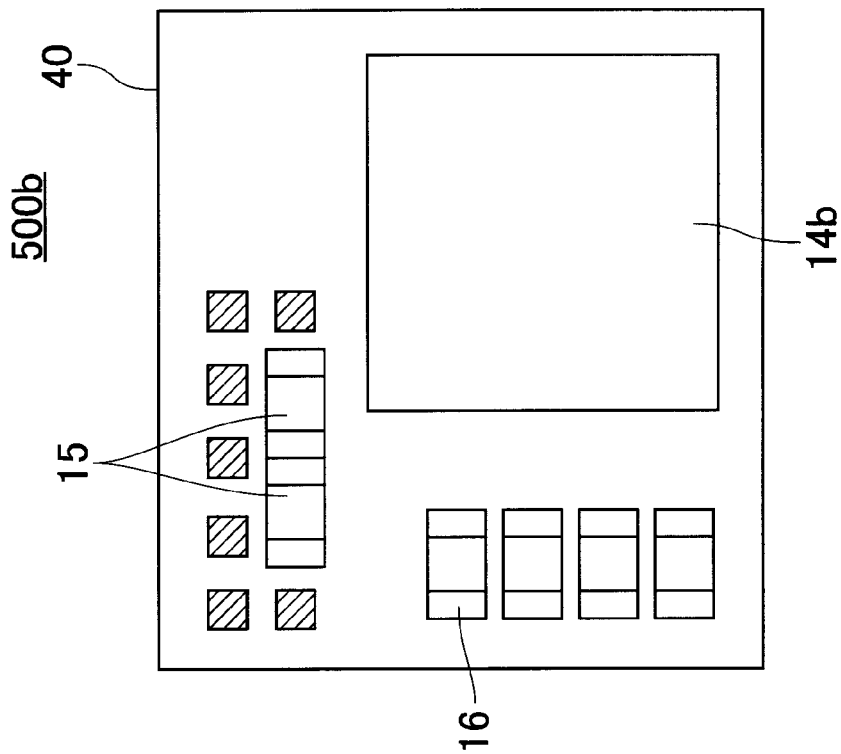
FIG. 9A illustrates an example of the mounting state of the circuit module according to the fifth preferred embodiment of the present invention and FIG. 9B illustrates another example of the mounting state of the circuit module according to the fifth preferred embodiment of the present invention.
Figure 9A:
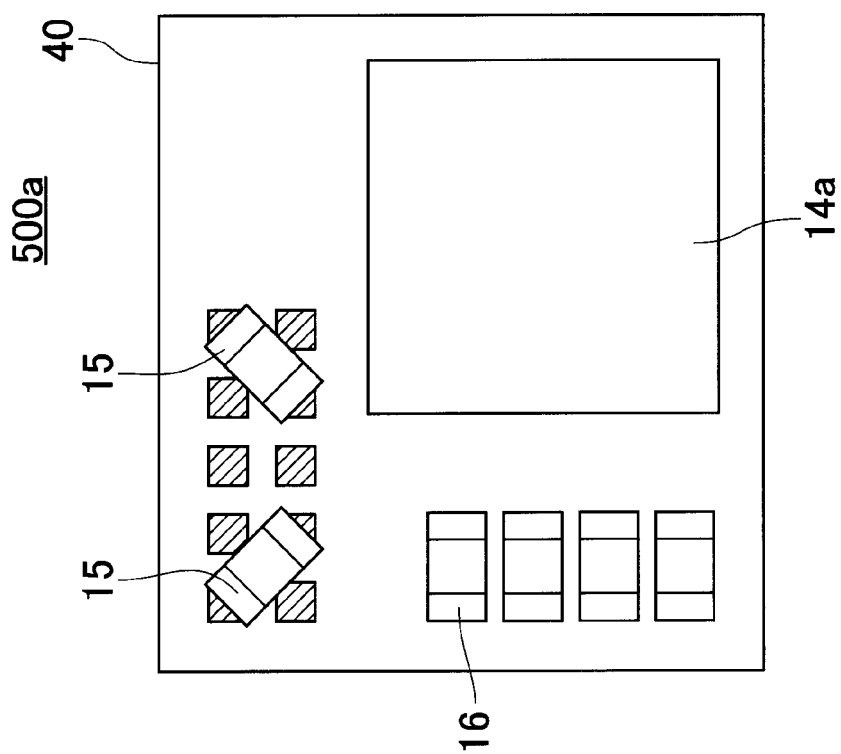

FIGS. 9A and 9B illustrate examples of the circuit module according to the fifth preferred embodiment of the present invention. Two module-discrimination electronic components of the same type are mounted on the circuit board 40 illustrated in FIG. 7. In the fifth preferred embodiment of the circuit module according to the present invention, a circuit board is used that has the same arrangement of land electrodes as the circuit board 40 used in the fourth preferred embodiment, but the electrical connection relations of the land electrodes 42a to 42j are different to those of the circuit board used in the fourth preferred embodiment. In the circuit board used in the circuit modules of FIGS. 9A and 9B, the land electrodes 42a to 42e, 42f, 42h and 42j of FIG. 7 are electrically connected to each other and the land electrodes 42g and 42i of FIG. 7 are electrically connected to each other. In addition, the land electrodes 42a to 42e, 42f, 42h and 42j are land electrodes that mount one terminal of each of the module-discrimination electronic components 15 and in addition the land electrodes 42g and 42i are land electrodes that mount the other terminal of each of the module-discrimination electronic components 15. For example, the land electrodes 42a to 42e, 42f, 42h and 42j are connected to the same ground electrode and the land electrodes 42g and 42i are connected to the same power supply wiring line.

With the above-described configuration, since the number of combinations of positions and/or orientations of two module-discrimination electronic components is greater than the number of positions and/or orientations that a single module-discrimination electronic component can take, the number of types of discrimination-target electronic component that can be discriminated between can be increased. For example, one terminal of one module-discrimination electronic component out of the two module-discrimination electronic components is arranged on the land electrode 42g and the other terminal can take a state of being mounted on any of the five land electrodes 42a, 42b, 42c, 42f and 42h, one terminal of the other module-discrimination electronic component is arranged on the land electrode 42i and the other terminal can take a state of being mounted on any one of the five land electrodes 42c, 42d, 42e, 42h and 42j and therefore the number of combinations of mounting states that the two module-discrimination electronic components can take is twenty-five. Consequently, in this example, the module-discrimination electronic components can take mounting states corresponding to twenty-five different types of discrimination-target electronic component. As illustrated in FIG. 9B, a plurality of module-discrimination electronic components can be mounted such they share the same land electrode with one of their terminals.

In addition, in the above-described fourth and fifth preferred embodiments described as examples of a preferred embodiment including a plurality of module-discrimination electronic components, cases were described in which, for example, there are a plurality of land electrodes that mount the other terminal of a module-discrimination electronic component, but in the fourth preferred embodiment, a case in which, for example, the land electrodes 42a to 42e and the land electrodes 42f to 42j are respectively coupled to one another to define single land electrodes and in the fifth preferred embodiment a case in which, for example, the land electrodes 42a to 42e, 42f, 42h and 42j are coupled one another to define a single land electrode are also possible.

In the fourth and fifth preferred embodiments, for the purpose of explanation, a circuit module in which two module-discrimination electronic components are mounted was described as an example, but a circuit module is not limited to this. That is, a circuit module in which three or more module-discrimination electronic components are mounted is also possible. In addition, the number and arrangement of land electrodes, the number of electronic components and the circuit configuration are not limited to those illustrated in the drawings for describing the first to fifth preferred embodiments.

Sixth to Ninth Preferred Embodiments

Circuit modules of sixth to ninth preferred embodiments of the present invention will be described while referring to FIGS. 10 to 13.

Figure 13:
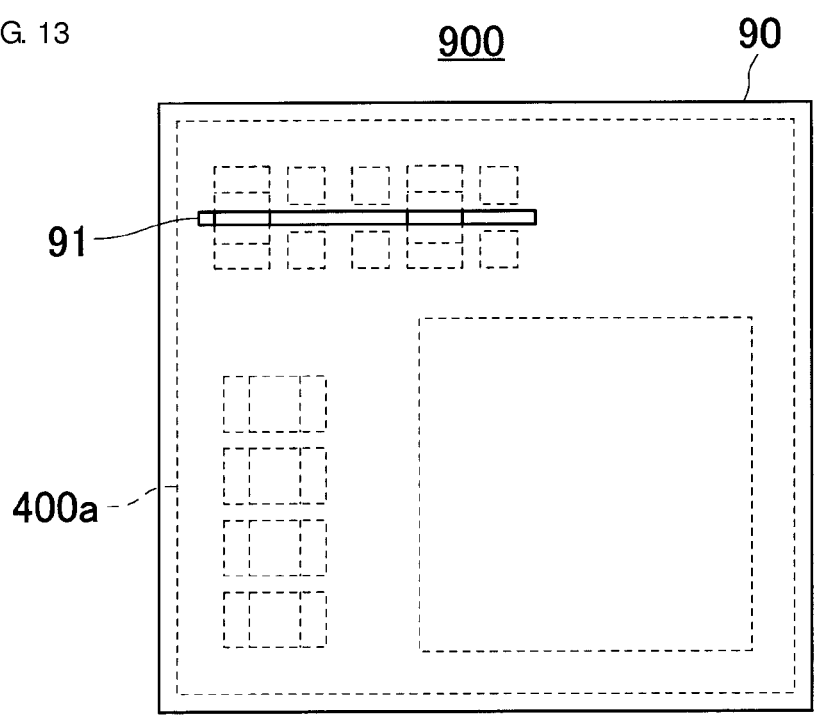
FIG. 13 illustrates an example of a circuit module according to a ninth preferred embodiment of the present invention.

FIGS. 10 to 13 respectively illustrate a circuit module 600 according to the sixth preferred embodiment, a circuit module 700 according to the seventh preferred embodiment, a circuit module 800 according to the eighth preferred embodiment and a circuit module 900 according to the ninth preferred embodiment. The circuit modules 600, 700, 800 and 900 according to the sixth to ninth preferred embodiments of the present invention are circuit modules according to any of the above-described preferred embodiments to which protective members 60, 70, 80 and 90 have been added over the electronic components mounted on the circuit board. The protective members 60, 70, 80 and 90 are arranged to protect the electronic components mounted on the circuit board and may be a metal case or a resin molded member, for example. The circuit modules 600, 700 and 800 illustrated in FIGS. 10, 11 and 12 are the circuit module 300a illustrated in FIG. 6A to which a protective member has been added. In addition, the circuit module 900 illustrated in FIG. 13 is the circuit module 400a illustrated in FIG. 8A to which a protective member has been added.

Two holes 61 are provided in the protective member 60 of the circuit module 600 of the sixth preferred embodiment above the two land electrodes 32b and 32c of FIG. 5. Consequently, when the circuit module 600 is viewed in plan, whether the module-discrimination electronic component 15 is mounted on the land electrode 32b or 32c can be visually checked.

An L-shaped or substantially L-shaped hole 71 as illustrated in FIG. 11 is provided in the protective member 70 of the circuit module 700 according to the seventh preferred embodiment so that the space between the land electrodes 32b and 32d and the space between the land electrodes 32c and 32d in FIG. 5 can be seen. Consequently, when the circuit module 700 is viewed in plan, whether the module-discrimination electronic component 15 is mounted on the land electrode 32b or 32c can be visually checked.

One hole 81 is provided above the four land electrodes 32a, 32b, 32c and 32d of FIG. 5 in the protective member 80 of the circuit module 800 according to the eighth preferred embodiment such that it is possible to see the land electrodes on which the module-discrimination electronic component 15 is not mounted among the four land electrodes 32a, 32b, 32c and 32d (in FIG. 12, land electrodes 32a and 32b) and the mounted module-discrimination electronic component 15. Consequently, when the circuit module 800 is viewed in plan, whether the module-discrimination electronic component 15 is mounted on the land electrode 32a, 32b or 32c can be visually checked.

A straight-line-shaped hole 91 as illustrated in FIG. 13 is provided in the protective member 90 of the circuit module 900 according to the ninth preferred embodiment such that the spaces between the land electrodes 42a to 42e and 42f to 42j of FIG. 7 can be seen. Consequently, when the circuit module 900 is viewed in plan, which of the land electrodes the two module-discrimination electronic components 15 are mounted on can be visually checked.

With the configurations of the circuit modules according to the sixth to ninth preferred embodiments of the present invention, the protective members 60, 70, 80 and 90 are provided above the circuit board and the electronic components and therefore the electronic components and the circuit board can be protected. In addition, holes are provided in the protective members 60, 70, 80 and 90 above a portion of or an entirety of module-discrimination electronic components such that the portion of or the entirety of the module-discrimination electronic components can be seen when the circuit module is viewed in plan, and therefore the mounting states of the module-discrimination electronic components can be visually checked, the discrimination-target electronic components mounted in the circuit module can be checked and circuit modules can be discriminated between.

In the sixth to ninth preferred embodiments, cases have been described in which the circuit module according to the present invention includes a protective member and the module-discrimination electronic components can be directly seen through a hole provided in the protective member, but even in a case where the module-discrimination electronic components cannot be directly seen due to, for example, there not being a hole in the protective member, a mounted electronic component can be seen by X-ray inspection through the protective member. That is, with the circuit modules according to various preferred embodiments of the present invention, even in the case where the electronic components are completely covered by the protective member, the circuit modules can be discriminated between similarly to as in the above-described preferred embodiments by checking the positions and/or orientations of the module-discrimination electronic components through the protective member by X-ray inspection.

Marks may or may not be provided on the surfaces of electronic components mounted in the circuit modules according to preferred embodiments described in the specification of this application to allow them to be discriminated between, but in the case where electronic components which do not have such marks are mounted, high-priced apparatuses for producing such marks are not needed and a step of marking electronic components can be omitted from the manufacturing process.

In addition, in the preferred embodiments described in the specification of the present application, it was described that the module-discrimination electronic components mounted in the circuit modules according to the present invention preferably are electronic components with two terminals, for example, but the module-discrimination electronic components are not limited to this. Here, in the case where a module-discrimination electronic component has three or more terminals, it is intended that the above-stated "one terminal of the module-discrimination electronic component" means any one terminal among the three or more terminals and "the other terminal of the module-discrimination electronic component" includes terminals other than the one terminal. In addition, the module-discrimination electronic component is not limited to being one that is connected to a ground electrode and a power supply wiring line and may be one connected to a signal wiring line through which, for example, a high-frequency signal passes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
   a circuit board; and
   electronic components mounted on the circuit board; wherein
   the electronic components include at least one discrimination-target electronic component and at least one module-discrimination electronic component;
   the circuit board includes land electrodes that are arranged to enable the module-discrimination electronic component to be mounted at different positions and/or orientations with respect to the circuit board;
   the module-discrimination electronic component is mounted at any one position and/or orientation among different positions and/or orientations with respect to the circuit board in accordance with a type of the discrimination-target electronic component;
   the land electrodes include a first land electrode that is quadrilateral-shaped or substantially quadrilateral-shaped, and a second land electrode that is defined by a unitary, continuously extending L-shaped or substantially L-shaped body; and
   the first land electrode and the second land electrode are arranged to enable the module-discrimination electronic component to be mounted at different positions and in different orientations with respect to the circuit board when the module-discrimination electronic component is mounted on the first land electrode and the second land electrode.

2. The circuit module according to claim 1, wherein one terminal of the module-discrimination electronic component is mounted at a certain position on the circuit board.

3. The circuit module according to claim 2, wherein
   the circuit board includes a plurality of land electrodes that mount another terminal of the module-discrimination electronic component; and
   the other terminal of the module-discrimination electronic component is mounted on any one of the plurality of land electrodes that mount another terminal of the module-discrimination electronic component in accordance with the type of the discrimination-target electronic component.

4. The circuit module according to claim 3, wherein the plurality of land electrodes that mount another terminal of the module-discrimination electronic component are electrically connected to each other by a connection electrode on a surface of or inside the circuit module.

5. The circuit module according to claim 1, wherein the electronic components are electrically connected to each other by a connection electrode on a surface of or inside the circuit module.

6. The circuit module according to claim 1, wherein the circuit module includes a plurality of module-discrimination electronic components.

7. The circuit module according to claim 1, wherein a vertical length and a horizontal length of the module-discrimination electronic component are different from each other when viewed in plan.

8. The circuit module according to claim 1, wherein the circuit module includes a protective member above the circuit board and the electronic components, and a hole or recess is provided in the protective member above a portion of or an entirety of the module-discrimination electronic component so as to allow the portion of or the entirety of the module-discrimination electronic component to be seen when the circuit module is viewed in plan.

9. The circuit module according to claim 1, wherein the circuit board is through hole mount board or a surface mount board.

10. The circuit module according to claim 1, wherein the circuit board is single-layer board or a multilayer board.

11. The circuit module according to claim 1, wherein the circuit board is made or resin or ceramic.

12. The circuit module according to claim 1, wherein the land electrodes include land electrodes connected to a ground electrode and land electrodes connected a power supply wiring line.

13. The circuit module according to claim 1, wherein the module-discrimination electronic component defines a discrimination marker.

14. The circuit module according to claim 1, wherein the first land electrode mounts one terminal of the module-discrimination electronic component, and the second land electrode mounts another terminal of the module-discrimination electronic component.

15. The circuit module according to claim 14, wherein the first land electrode is connected to a power supply wiring line and the second land electrode is connected to a ground electrode.

16. The circuit module according to claim 14, wherein the first land electrode is connected to a ground electrode and the second land electrode is connected to a power supply wiring line.

17. The circuit module according to claim 1, further comprising a plurality of the module-discrimination electronic component of the same type.

18. The circuit module according to claim 8, wherein the protective member is a metal case or a resin molded member.

19. The circuit module according to claim 8, wherein the hole is L-shaped, substantially L-shaped or straight line shaped.

20. The circuit module according to claim 1, further comprising a plurality of the protective members arranged to protect the electronic components mounted on the circuit board.

* * * * *